United States Patent [19]

Cuppen

[11] Patent Number: 4,682,109
[45] Date of Patent: Jul. 21, 1987

[54] METHOD AND DEVICE FOR DETERMINING AN NMR DISTRIBUTION IN A REGION OF A BODY

[75] Inventor: Johannes J. M. Cuppen, Eindhoven, Netherlands

[73] Assignee: U.S. Philips Corporation, New York, N.Y.

[21] Appl. No.: 786,557

[22] Filed: Oct. 11, 1985

[30] Foreign Application Priority Data

Nov. 29, 1984 [NL] Netherlands .......................... 8403627

[51] Int. Cl.$^4$ .......................................... G01R 33/20
[52] U.S. Cl. ................................... 324/309; 324/312; 128/653
[58] Field of Search ................ 128/653; 324/300, 307, 324/309, 312; 364/413, 414

[56] References Cited

U.S. PATENT DOCUMENTS 4,545,384 12/1985 Kawachi ............................. 324/309
4,567,893 2/1986 Charles et al. ..................... 324/309
4,604,578 8/1986 Young ................................. 324/307

FOREIGN PATENT DOCUMENTS 2411497 2/1975 Fed. Rep. of Germany.

Primary Examiner—Stewart J. Levy
Assistant Examiner—Kevin D. O'Shea
Attorney, Agent, or Firm—Robert T. Mayer; Algy Tamoshunas

[57] ABSTRACT

Disclosed is a method and the device for making NMR images which utilize additional measurements and additional calculations in order to achieve a substantial reduction of image artefacts caused by (respiratory) motions of the body. The additional measurements involve the sampling of the non-conditioned FID or echo signal which can (but need not) be performed during each measurement cycle without consuming a substantial amount of additional measurement time. The non-conditioned signal samples are used to derive a frequency spectrum which is a measure of the size of the object. By comparison of the frequency spectra of the various measurement cycles, standardization is obtained so that image signals produce an unambiguous image even though they have been derived from signal samples from measurement cycles performed in different states of motion (different object size).

11 Claims, 5 Drawing Figures

METHOD AND DEVICE FOR DETERMINING AN NMR DISTRIBUTION IN A REGION OF A BODY

The invention relates to a method of determining an NMR distribution in a region of a body in which, in the presence of a steady uniform magnetic field, a nuclear spin resonance signal is generated during a number of successive measurement cycles by means of an r.f. electromagnetic pulse. The resonance signal is conditioned during a preparation period and sampled during a subsequent measurement period in order to obtain a group of signal samples from which, after signal transformation thereof, an image of an NMR distribution is determined.

The invention also relates to a device for determining an NMR distribution in a region of a body, comprising:

(a) means for generating a steady, uniform magnetic field, (b) means for generating an r.f. electromagnetic radiation, (c) means for generating a gradient magnetic field, (d) sampling means for taking signal samples of a resonance signal generated by the means specified in the paragraphs (a) and (b), (e) processing means for processing the signal samples in order to form an NMR distribution, and (f) control means for controlling at least the means specified in the paragraphs (b) to (e) for generating, conditioning and sampling a number of resonance signals and for processing the signal samples.

Such a method and device are known from German Pat. Application DE-OS 26,11,497 which corresponds to U.S. Pat. No. 4,070,611. According to the method described therein, one row of a two (or three-) dimensional image frequency matrix is filled with signal samples during each measurement cycle. After the entire matrix has been filled, an image of the nuclear magnetization can be obtained by way of a two- (or three-) dimensional Fourier transformation. When an image having a reasonable resolution is desired (for example, 128×128 pixels), a measurement period of a few minutes will be required. When a body to be examined moves or is moved, defects or unsharpness will occur in the image. When measurements are performed on a human torso, image defects due to respiratory (and cardiac) motions will be unavoidable.

The foregoing defects cannot be avoided either by means of a method or device as disclosed in Netherlands Patent Application No. 82.03519, even though the total measurement period can thus be reduced by a factor 2 or more. It is the object of the invention to provide a method and a device in which the defects caused by motions of the body being measured are at least reduced.

To achieve this, a method in accordance with the invention is characterized in that a non-conditioned nuclear spin resonance signal is generated and sampled at least during a number of measurement cycles each time in the presence of the same gradient magnetic field in order to obtain a row of reference signal samples, the gradient direction being coincident with direction of motion of the body. The reference signal samples then used during the signal transformation of the signal samples taken in order to reduce the effects of body motions.

A device in accordance with the invention is characterized in that the processing means comprise: signal transformation means for determining frequency spectra from the reference signal samples, storage means for the storage of at least one of the frequency spectra, and comparison means for comparing a frequency spectrum thus determined with the frequency spectrum stored in the storage means. The comparison means supplies correction factors for the correction of values to be derived from the signal samples associated with the frequency spectrum.

Embodiments in accordance with the invention will be described in detail hereinafter with reference to the accompanying drawing wherein.

Figure 3:
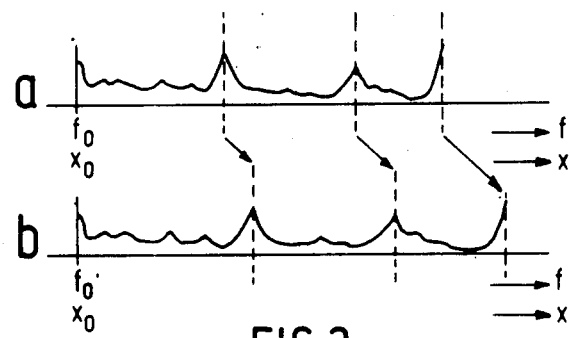
Figure 4:
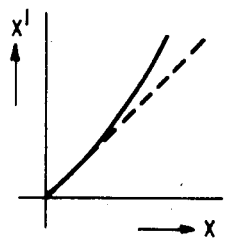
Figure 5:
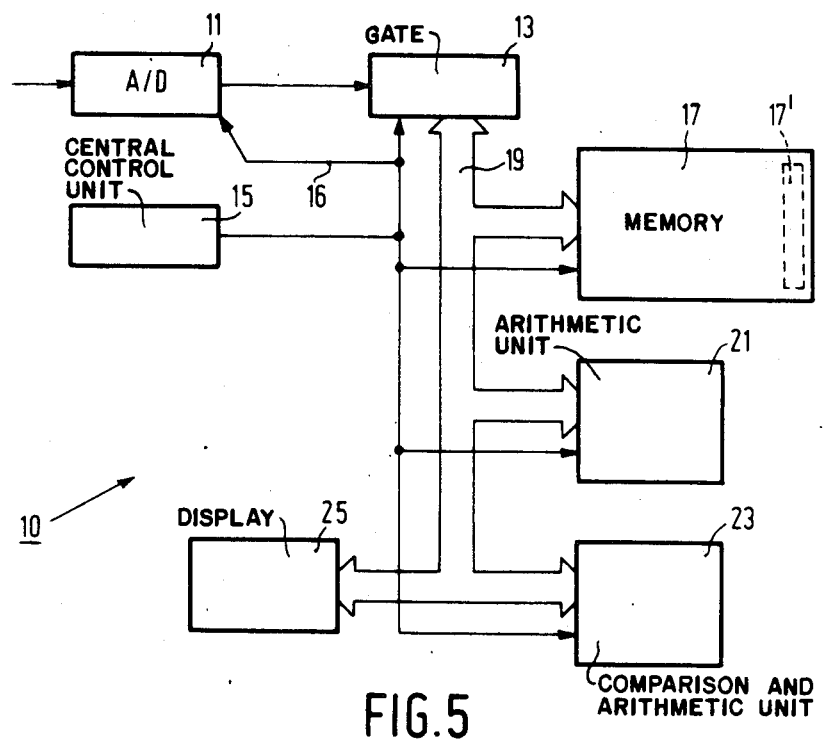

FIGS. 3a and b show frequency spectra of the body in the two states of motion,

FIG. 4 shows a coordinate relation of images of the two states of motion of the body, and FIG. 5 shows an embodiment of the processing means of a device in accordance with the invention.

Figure 1:
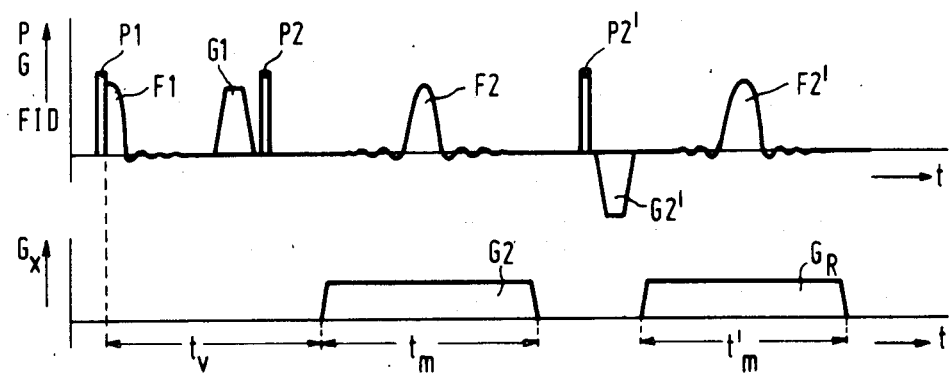
FIG. 1 shows a measurement cycle of a method in accordance with the invention.

FIG. 1 shows a measurement cycle of a method in accordance with the invention. Using an r.f. 90° pulse P1, magnetizations of nuclear spins in a body in a steady uniform magnetic field are made to perform a processional motion about the direction of said field, thus generating a resonance signal F1 (FID signal). During a preparation period $t_v$ subsequent to the pulse P1, a nuclear spin echo signal F2, generated by means of an r.f. 180° pulse P2, is conditioned by a gradient magnetic field G1 (in the x, y or z-direction) which has a different intensity during each measurement cycle. The echo signal F2 is sampled during a measurement period $t_m$ subsequent to the preparation period $t_v$. A constant $G_x$ gradient magnetic field G2 is applied during the measurement period $t_m$. The signal samples taken during $t_m$ are stored in storage means of a section of a device in accordance with the invention which is hereinafter described. After expiration of the measurement period $t_m$, a second nuclear spin echo signal F2' is generated by means of a second r.f. 180° pulse P2'. The second spin echo signal is brought into a non-conditioned state by applying, after the 180° pulse P2', a gradient field G2' which is opposed to the conditioning gradient field G1 applied for the first 180° pulse P2. During an additional measurement period $t_m'$, reference signal samples are taken from the non-conditioned echo signal F2' in the presence of a constant gradient field $G_R$ (in this example a Gx gradient field as will be explained hereinafter).

It will be apparent that, in addition to the way of obtaining non-conditioned signal samples described above, the signal F1 can also be sampled during the preparation period $t_v$ before the gradient field G1 is applied. Conditioning can also be achieved by using different values for the preparation period $t_v$ during successive measurement cycles.

Figure 2:
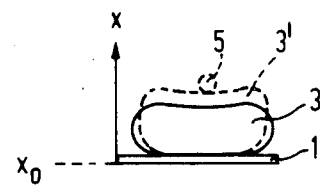
FIG. 2 shows two states of motion of a body being measured.

FIG. 2 shows a body 3 which is positioned on a table 1 as is customarily done in known devices (for example, as described in DE-OS 26,11,497 and in NL.A 82.03519). When measurements are performed, for example on a human torso, the body 3 will move, for example due to respiration. The reference numeral 3 represents the state of motion of the body after exhalation and the reference numeral 3' (denoted by a broken line) represents the state after inhalation. As is shown, the motion occurs mainly in the x-direction. When signal samples are taken during successive measurement cycles (during the measurement periods $t_m$) and simply processed so as to form an image, such an image will be affected by defects and blurring due to the described motion. When a non-conditioned nuclear spin echo signal is sampled in the presence of a $G_x$ gradient magnetic field, for example in the exhaled state (of motion), a signal transformation (generally a Fourier transformation) will produce a frequency spectrum as shown in FIG. 3a. Because the nuclear spin echo signal has been measured in the presence of a Gx gradient field, a one-dimensional frequency spectrum will be obtained after 1-D Fourier transformation of the reference signal samples, the bandwidth of said frequency spectrum being a measure of the object dimension in the x-direction. Assuming that the intensity of the $G_x$ gradient field increases in the positive x-direction, the lowest frequency $f_o$ in the spectrum will be associated with the position $x=x_o$ in which the body 3 rests on the table 1 (see FIGS. 2 and 3a). The highest frequency will be associated with the side of the body 3 which is remote from the table. It will be understood that in the inhaled state of the body 3' (FIG. 2) the frequency band will be wider as is diagrammatically shown in FIG. 3b. In order to obtain a suitably defined limit at the upper side of the frequency band shown in the FIGS. 3a and 3b, an object 5 (for example, a container filled with water) which supplies a strong resonance signal is positioned on the body 3, 3'. Comparison of the frequency bandwidth will reveal how much the moving outer side of the body 3 is displaced; the amount of displacement of the layers present between the outer side and the table can be established by comparison of some significant (recognizable) peaks in both spectra (FIGS. 3a and 3b); this is diagrammatically denoted by arrows between the FIGS. 3a and 3b. From the foregoing comparison a relation can be established (for example, by extrapolations) between the positions x' of different layers in the body 3' (inhaled state) and the positions x of the same layers of the body 3 (exhaled state). FIG. 4 shows an example of such a relation. For the purpose of comparison FIG. 4 also shows the straight line x=x' which is denoted by a broken line. The data concerning the motions of the body 3 which are contained in the frequency spectra can be utilized in various ways. According to one method reference signal samples are taken during each measurement cycle, which samples are converted into a frequency spectrum. From these spectra it can be deduced whether the signal samples taken during the measurement cycle are associated with an inhaled or an exhaled state of motion (or with a third, "intermediate" state). On the basis of the determined spectra, the signal samples can be classified in sub-groups wherefrom sub-images are formed by means of one of the known methods. One of the sub-images is declared to be the "standard" and the other sub-images are stretched (from x to x') or compressed (from x' to x), utilizing correction factors derived from the frequency spectra associated with the sub-groups and the spectrum associated with the "standard", depending on whether the inhaled or the exhaled state is chosen as the "standard". Such stretching and compression can be performed in various ways, for example linearly across the entire image, or leaving one image half (in the x-direction!) undisturbed and performing the operation linearly across the other image half, or via a non-linear distortion utilizing a curve to be determined, as shown in FIG. 4. It will be apparent that it is alternatively possible to take reference signal samples only during a few measurement cycles when a given state of motion is reached (exhaled or inhaled) which state of motion is detected by a (mechanical) detector. This is because, after said (two) states of motion have been reached, the state remains stationary for some time so that all signal samples taken during this period are associated with a given sub-group which can be corrected by means of correction factors which need be determined only once.

FIG. 5 shows the processing means of a device in accordance with the invention. A demodulated nuclear spin echo signal is applied to an analog-to-digital converter 11 which applies the digitized signal samples to an input gate 13. The A/D converter 11 and the input gate 13 both receive control signals from a central control unit 15 via a control bus 16. The digital signal samples are transferred from the input gate 13, via the data bus 19, to a memory 17 under the control of the control unit 15 via the control bus 16. It will be apparent that the reference signal samples follow the same route. The reference signal samples stored in the memory 17 are fetched by the control unit 15 in order to be applied to an arithmetic unit 21 in which the reference signal samples of a measurement cycle are subjected to a 1-D Fourier transformation. The resultant frequency spectrum is stored in a section 17' of the memory 17. The frequency spectra thus determined are used by a comparison and arithmetic unit 23 in order to form sub-groups from the signal samples stored in the memory 17, which sub-groups are associated with the same phase of motion. A 1-D Fourier transformation is performed twice (or three times) on the sub-groups by the arithmetic unit 21 in order to obtain a two- (or three-) dimensional sub-image per sub-group, at least the first sub-image formed being stored in the memory 17 in order to serve as a basis for the ultimate total image. Because the sub-images are formed row-wise or column-wise, the last 1-D Fourier transformation of the further sub-images is preferably performed in the "x-direction", after which the comparison and arithmetic unit 23 performs an x-coordinate correction by means of the frequency spectra stored in the memory section 17' on the row of values obtained, which values have an x-coordinate dependency. After correction, the corrected row of values is added to the values of the corresponding row of the first "standard" sub-image determined, which values are fetched from the memory 17. The new values thus obtained are stored again in the same location in the memory 17.

Upon completion of an image, i.e. after combination of the first sub-image and the standardized sub-image (sub-images), it can be displayed on a display device 25.

It is to be noted that although in the embodiment shown in FIG. 1, 90° r.f. pulses and 180° r.f. pulses are used, the use of other pulses (e.g. smaller than 90° r.f. pulse) can also be used. It will also be clear that although in FIG. 1 a so called spin-echo technique has been shown, the method in accordance with the invention is not restricted to the spin echo technique and can be used in the various measuring methods, which are well known within the field of nuclear magnetic resonance imaging.

What is claimed is

1. A method of determining an NMR distribution in a region of a body in which, in the presence of a steady uniform magnetic field, a nuclear spin resonance signal is generated during a number of successive measurement cycles by means of an r.f. electromagnetic pulse, which resonance signal is conditioned during a preparation period and sampled during a subsequent measurement period in order to obtain a group of first signal samples from which, after signal transformation thereof, an image of an NMR distribution is determined, characterized in that a non-conditioned nuclear spin resonance signal is generated and sampled at least during a number of measurement cycles each time in the present of a gradient magnetic field which is the same during each sampling of said non-conditioned resonance signal in order to obtain a row of reference signal samples, the gradient direction of the gradient field being coincident with a direction of motion of the body, after which the reference signal samples are used during the signal transformation of the first signal samples to reduce the effects of body motions.

2. A method as claimed in claim 1, characterized in that a non-conditioned nuclear spin resonance signal is generated and sampled during each measurement cycle.

3. A method as claimed in claim 2, characterized in that the reference signal samples taken during a measurement cycle are used to standardize the first signal samples of the same measurement cycle, after which an image of an NMR distribution is determined from the standardized values derived from the first signal samples.

4. A method as claimed in any one of the claims 1 to 3, characterized in that during the taking of the first signal samples there is applied a measurement gradient field whose field direction is the same as that of the gradient field applied during the taking of the reference signal samples.

5. A method as claimed in any one of the claims 1 to 3, characterized in that during the taking of the first signal samples there is applied a measurement gradient field whose gradient direction extends at right angles to that of the gradient field applied during the taking of reference signal samples.

6. A method as claimed in claim 2, characterized in that the reference signal samples are used to group the first signal samples of all measurement cycles in at least two sub-groups of measurement cycles in a given state of motion of the body, after which a sub-image is formed from each sub-group each sub-image being standardized by means of the reference signal samples of a measurement cycle associated with that sub-image, after which the standardized sub-images are combined so as to form one image.

7. A method as claimed in any one of the claims 1, 2 or 3 to 6, characterized in that the reference signal samples are taken after excitation and before conditioning during the preparation period of the resonance signal.

8. A method as claimed in any one of the claims 1, 2 or 3 characterized in that the reference signal samples are taken from a nuclear spin echo signal formed by means of a 180° r.f. pulse, after compensation for the conditioning performed during the preparation period.

9. A method as claimed in claim 1, characterized in that during a measurement cycle, reference signal samples are taken when one of at least two predetermined detectable states of motion of the body is reached, after which at least two sub-groups which are associated with the predetermined detectable states of motion are formed from the first signal samples, which sub-groups are used to form sub-images which are standardized by means of the reference signal samples from the measurement cycle associated with the relevant state of motion, after which the sub-images are combined so as to form one image.

10. A device for determining an NMR distribution in a region of a body, comprising:
 (a) means for generating a steady, uniform magnetic field,
 (b) means for generating r.f. electromagnetic radiation so as to produce a resonance signal,
 (c) means for generating a gradient magnetic field,
 (d) sampling means for taking signal samples of said resonance signal,
 (e) processing means for processing the signal samples in order to form an NMR distribution, and
 (f) control means for controlling at least the means specified in sections (b) to (e) so as to produce, condition and sample a number of said resonance signals and to process the signal samples, characterized in that the processing means comprise: signal transformation means for determining frequency spectra from reference signal samples, storage means for storing at least one of the frequency spectra, and comparison means for comparing a given frequency spectrum determined by said signal transformation means with the frequency spectrum stored in the storage means, said comparison means supplying correction factors for correction of values to be derived from the signal samples associated with said given frequency spectrum.

11. An apparatus for producing an NMR image of a region of a body, said apparatus comprising means for generating a steady, uniform magnetic field, means for generating an RF electromagnetic pulse so as to cause precessional motion of nuclear spins in the body under examination disposed in said steady magnetic field to thereby generate a resonance signal, means for generating a gradient magnetic field, means for taking signal samples of said resonance signal, means for controlling said pulse generating means, said gradient field generating means and said sample taking means so that during a first measurement period in successive measurement cycles, a plurality of first signal samples are taken of said resonance signal which is conditioned by varying the intensity of said gradient field from measurement cycle to measurement cycle or by varying the time duration during which the body under examination is exposed to said gradient field, and so that during a second measurement period in at least some of said measurement cycles, a plurality of reference signal samples are taken of said resonant signal which is non-conditioned, said reference signal samples being taken in the presence of a gradient field which is the same during said second measurement period of each measurement cycle during which said reference signal samples are taken, and means for forming, from said first signal samples and said reference signal samples, an NMR image of said region of said body being examined, said image forming means including means for using said reference signal samples to modify transformation of the first signal samples so as to reduce the effect on said image of movements of said body during examination thereof.

* * * * *